(12) United States Patent
Pellizzer et al.

(10) Patent No.: US 7,606,056 B2
(45) Date of Patent: Oct. 20, 2009

(54) PROCESS FOR MANUFACTURING A PHASE CHANGE MEMORY ARRAY IN CU-DAMASCENE TECHNOLOGY AND PHASE CHANGE MEMORY ARRAY THEREBY MANUFACTURED

(75) Inventors: Fabio Pellizzer, Follina (IT); Roberto Bez, Milan (IT); Maria Santina Marangon, Merate (IT); Roberta Piva, Concorezzo (IT); Laura Aina, Lesmo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 515 days.

(21) Appl. No.: 11/317,622

(22) Filed: Dec. 22, 2005

(65) Prior Publication Data

US 2007/0148814 A1    Jun. 28, 2007

(51) Int. Cl.
*G11C 5/06* (2006.01)
(52) U.S. Cl. ............... 365/63; 257/2; 365/148; 365/163; 438/95; 438/128
(58) Field of Classification Search ........... 257/2–5; 365/63, 148, 163; 438/95, 128
See application file for complete search history.

(56) References Cited

U.S. PATENT DOCUMENTS

| | | | |
|---|---|---|---|
| 5,789,277 A | 8/1998 | Zahorik et al. | 438/95 |
| 5,814,527 A | 9/1998 | Wolstenholme et al. | 438/5 |
| 5,869,843 A | 2/1999 | Harshfield | 257/5 |
| 5,933,365 A | 8/1999 | Klersy et al. | 365/148 |
| 5,952,671 A | 9/1999 | Reinberg et al. | 257/3 |
| 5,970,336 A | 10/1999 | Wolstenholme et al. | 438/238 |
| 6,031,287 A | 2/2000 | Harshfield | 257/734 |
| 6,531,373 B2 * | 3/2003 | Gill et al. | 438/400 |

(Continued)

FOREIGN PATENT DOCUMENTS

EP    1 318 552 A1    6/2003

(Continued)

OTHER PUBLICATIONS

Palun, L. et al., "Fabrication of Single Electron Devices by Hybrid (E-Beam/DUV) Lithography," *Microelectronic Engineering 53*, pp. 167-170, 2000.

*Primary Examiner*—Tuan T Nguyen
*Assistant Examiner*—Alexander Sofocleous
(74) *Attorney, Agent, or Firm*—Lisa K. Jorgenson; Robert Iannucci; Seed IP Law Group PLLC (57) ABSTRACT

A process for manufacturing a phase change memory array includes the steps of: forming a plurality of phase change memory cells in an array region of a semiconductor wafer, the phase change memory cells arranged in rows and columns according to a row direction and to a column direction, respectively; forming a control circuit in a control region of the semiconductor wafer; forming a plurality of first bit line portions for mutually connecting phase change memory cells arranged on a same column; forming first level electrical interconnection structures; and forming second level electrical interconnection structures above the first level electrical interconnection structures. The first level electrical interconnection structures include second bit line portions laying on and in contact with the first bit line portions and projecting from the first bit line portions in the column direction for connecting the first bit line portions to the control circuit.

28 Claims, 7 Drawing Sheets

U.S. PATENT DOCUMENTS

| | | |
|---|---|---|
| 6,969,866 B1 | 11/2005 | Lowrey et al. ................. 257/3 |
| 7,071,485 B2 * | 7/2006 | Takaura et al. ................ 257/3 |
| 7,227,171 B2 * | 6/2007 | Bez et al. ...................... 257/3 |
| 7,244,956 B2 * | 7/2007 | Pellizzer ........................ 257/2 |
| 7,391,642 B2 * | 6/2008 | Gordon et al. .............. 365/163 |
| 2001/0002046 A1 | 5/2001 | Reinberg et al. ............... 257/3 |
| 2002/0017701 A1 | 2/2002 | Klersy et al. ................ 257/536 |
| 2002/0080647 A1 | 6/2002 | Chiang et al. .............. 365/175 |
| 2003/0075778 A1 | 4/2003 | Klersy ........................ 257/536 |
| 2003/0219924 A1 | 11/2003 | Bez et al. .................... 438/102 |

FOREIGN PATENT DOCUMENTS

| | | |
|---|---|---|
| EP | 1 326 254 A1 | 7/2003 |
| WO | WO 00/57498 | 9/2000 |
| WO | WO 02/09206 A1 | 1/2002 |

* cited by examiner

PROCESS FOR MANUFACTURING A PHASE CHANGE MEMORY ARRAY IN CU-DAMASCENE TECHNOLOGY AND PHASE CHANGE MEMORY ARRAY THEREBY MANUFACTURED

BACKGROUND OF THE INVENTION

1. Field of the Invention

The present invention relates to a process for manufacturing a phase change memory array in Cu-damascene technology and to a phase change memory array thereby manufactured.

2. Description of the Related Art

As is known, phase change memory (PCM) elements exploit the characteristics of materials that have the property of changing between two phases having distinct electrical characteristics. For example, these materials may change from an amorphous phase, which is disordered, to a crystalline or polycrystalline phase, which is ordered, and the two phases are associated to considerably different resistivities.

At present, alloys of group VI of the periodic table, such as Te or Se, referred to as chalcogenides or chalcogenic materials, can advantageously be used in phase change cells. The chalcogenide that currently offers the best promises is formed by a Ge, Sb and Te alloy ($Ge_2Sb_2Te_5$, GST) and is widely used for storing information in overwritable disks.

The use of the PCM elements for forming memory cells and arrays has already been proposed. In this case, the PCM elements are generally associated to selection elements, such as MOS transistors, bipolar transistors, or diodes, in order to prevent disturbs and noise caused by adjacent memory cells.

Processes for manufacturing PCM cells and arrays has been already proposed as well and an example whereof will be briefly discussed hereinafter; a detailed description of a known manufacturing process may also be found in U.S. patent application Ser. No. 10/313,991, in the name of STMicroelectronics, S.r.l., which application is incorporated herein by reference in its entirety.

According to known processes, selection elements are normally first formed in the substrate of a semiconductor wafer; then, a dielectric layer is deposited on the substrate, so as to cover the selection elements, and heaters are formed in the dielectric layer. The heaters are usually made as cup-shaped regions of resistive material, filled with an insulator, and are electrically coupled to conduction terminals of respective selection elements. A mold layer of silicon nitride is formed on the dielectric layer and the heaters, and then etched to open microtrenches above the heaters; the microtrenches are arranged in rows and columns to form an array and, preferably, have sublithographic dimensions. A conductive stack comprising at least a chalcogenide layer of GST and a conductive layer, normally of AlCu, is then laid on the mold layer, so that the chalcogenide layer fills the microtrenches and contacts the heaters. Phase change regions are thus formed at the intersections between the microtrenches filled with chalcogenide material and the heaters. The conductive stack is then shaped to form a plurality of conductive bit lines which connect phase change regions arranged on a same column. The process is the terminated by forming word lines, connection lines for biasing the bit lines and the word lines, and by depositing a passivation layer.

However, known processes have some limitations. In particular, shaping the conductive stack for defining the bit lines is somewhat complicated. In fact, the conductive layer of AlCu and the chalcogenic layer of GST require different etching agents, which affect each other and are scarcely compatible. Hence, the etch of the AlCu/GST stack is difficult and high precision can not be reached; hence, also the yield of the overall process is not optimal.

In addition, connection lines for biasing the bit lines and the word lines are normally formed all at a same level above the cells of an array. Thus problems may derive from a high density of conductive paths laying close to one another (e.g. capacitive coupling) and design is in any case quite complex.

BRIEF SUMMARY OF THE INVENTION

In one embodiment, the present invention provides a process for manufacturing PCM arrays which is free from the above-described drawbacks.

In one embodiment, a process for manufacturing a phase change memory array is provided, comprising: forming a plurality of phase change memory cells in an array region of a semiconductor wafer, the phase change memory cells being arranged in rows and columns according to a row direction and to a column direction, respectively; forming a control circuit in a control region of the semiconductor wafer; forming a plurality of first bit line portions for mutually connecting phase change memory cells arranged on a same column; forming first level electrical interconnection structures; and forming second level electrical interconnection structures above the first level electrical interconnection structures, wherein the first level electrical interconnection structures include second bit line portions laying on and in contact with the first bit line portions and projecting from the first bit line portions in the column direction for connecting the first bit line portions to the control circuit.

In another embodiment, a phase change memory array is provided, comprising: a plurality of phase change memory cells arranged in an array region of a semiconductor wafer, the phase change memory cells arranged in rows and columns according to a row direction and to a column direction, respectively; a control circuit arranged in a control region of the semiconductor wafer; a plurality of first bit line portions for mutually connecting phase change memory cells arranged in a same column; first level electrical interconnection structures; and second level electrical interconnection structures arranged above the first level electrical interconnection structures, wherein the first level electrical interconnection structures include second bit line portions laying on and in contact with the first bit line portions and projecting from the first bit line portions in the column direction for connecting the first bit line portions to the control circuit.

BRIEF DESCRIPTION OF THE SEVERAL VIEWS OF THE DRAWINGS

For a better understanding of the present invention, some preferred embodiments thereof are now described, purely by way of non-limiting example, with reference to the attached drawings, in which.

DETAILED DESCRIPTION OF THE INVENTION

An embodiment of the present invention is shown in FIGS. 1-18. A semiconductor wafer 100, comprising a substrate 101 of P-type, is initially subjected to standard front end steps. In particular, shallow trench insulation structures 102 are formed, which delimit first active areas 104 and second active areas 105 in an array region 106 and in a control region 107 of the wafer 100, respectively. The first active areas 104 are arranged in rows 109, according to a row direction Y, and in columns 110, according to a column direction X.

Figure 1:
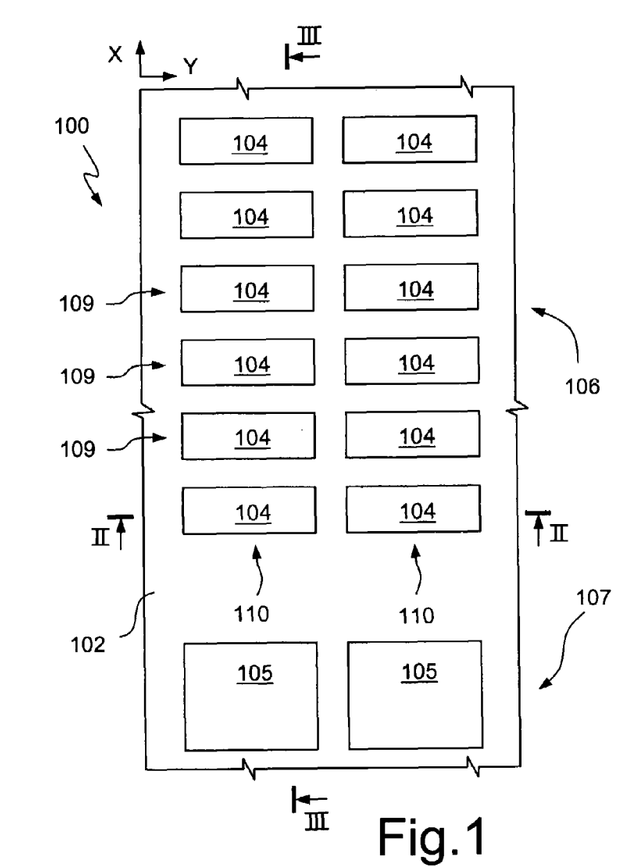
FIG. 1 is a top plan view of a semiconductor wafer in an initial step of a manufacturing process according to a first embodiment of the present invention.
Figures 2, 3:
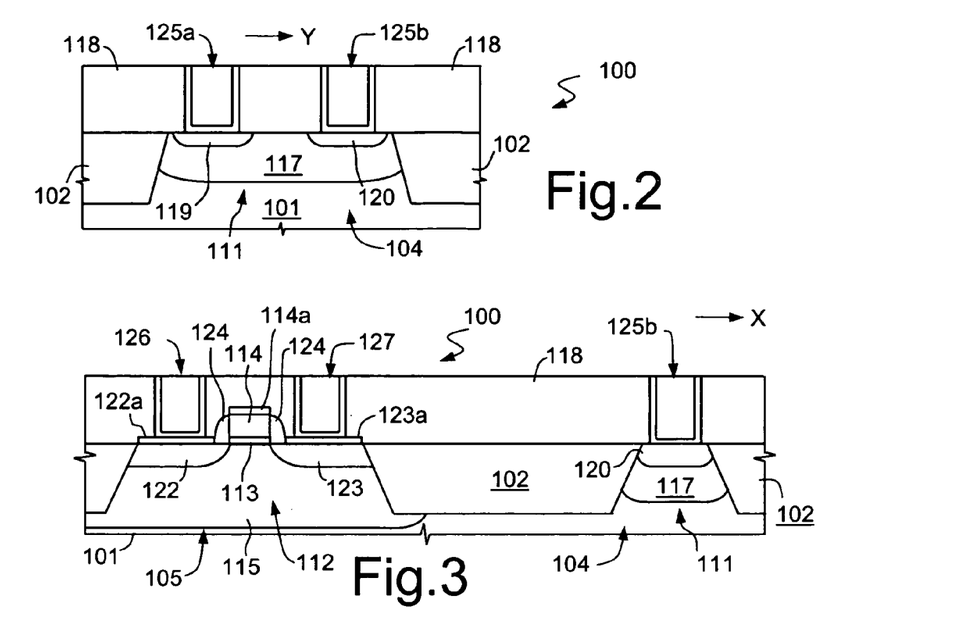
FIGS. 2 and 3 are cross section through the semiconductor wafer of FIG. 1, in a subsequent manufacturing step, taken along lines II-II and III-III of FIG. 1, respectively.
Figure 4:
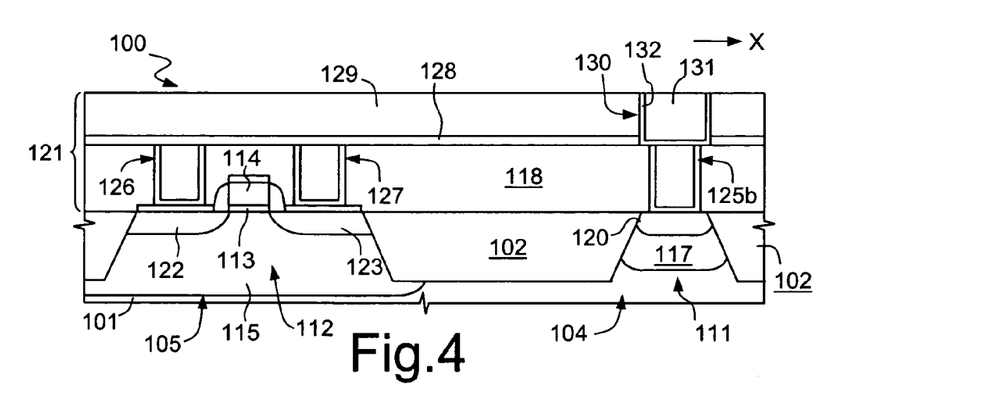
FIGS. 4 and 5 show the same view as FIG. 3, in subsequent manufacturing steps.
Figure 18:
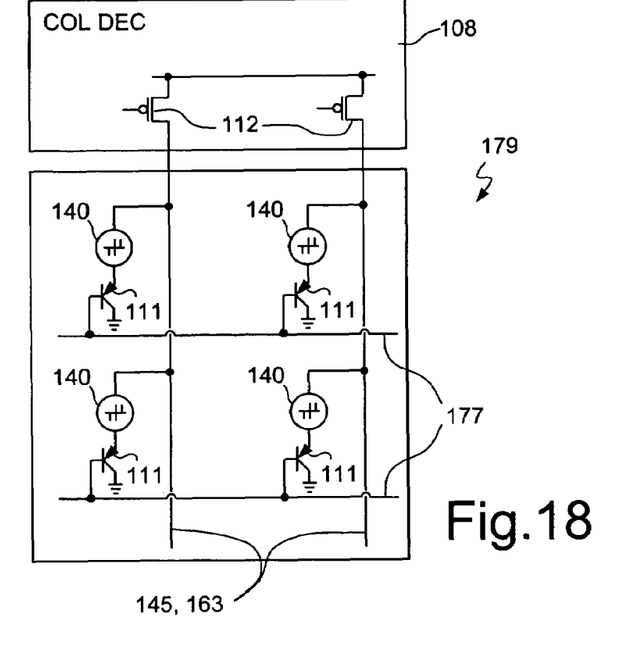
FIG. 18 is a simplified block diagram of a phase change memory device incorporated in the semiconductor wafer of FIGS. 16 and 17.

By conventional implantation, deposition and etching steps, selection elements 111 (PNP bipolar transistors in this embodiment) and column decoding transistors 112 of PMOS type are formed in the first active areas 104 and in the second active areas 105, respectively (FIGS. 2 and 3; a column decoder 108, which the column decoding transistors 112 belong to, is schematically shown in FIG. 18). More precisely, N-type dopants are selectively implanted in the first active areas, for forming base regions 117, and in the second active areas for forming wells 115. After thermally growing a thin gate oxide layer 113, a polysilicon layer (not shown) is deposited and defined for creating gate regions 114 above the second active areas 105. Spacers 124 are then formed on sides of the gate regions 114, in a known manner. Surface layers 114a, 122a, 123a of the gate regions 114, of the source regions 122 and of the drain regions 123, respectively, are made highly conductive by silicidation. Next, a first dielectric layer 118 is deposited and planarized; openings are formed in the first dielectric layer 118 above the base regions 117 and above the second active areas 105, which are therefore exposed. Then, two dedicated masks (not shown) are used during subsequent implantations, for selectively creating base contact regions 119 ($P^+$) and emitter regions 120 ($N^+$), in the base regions 117, and source regions 122 and drain regions 123 (both $P^+$) in the second active areas 105. Then, the openings in the first dielectric layer 118 are covered by a barrier layer, for example a Ti/TiN layer, before being filled with tungsten to form base contacts 125a, emitter contacts 125b, source contacts 126 and drain contacts 127. Thus, the structure of FIGS. 2 and 3 is obtained.

Next (FIG. 4), a second dielectric layer 128, of silicon nitride, and a third dielectric layer 129, of undoped silicon glass (USG), are deposited on the first dielectric layer 118 to create a first dielectric structure 121. Openings 130 are formed therein above the emitter contact 125b. The openings 130 have dimensions dictated by the lithographic process and ovalized in the embodiment herein described. In alternative embodiments, the shape of the openings 130 may be, for example, circular, rectangular or square. Next, a heating layer, for example of TiSiN, TiAlN or TiSiC, is deposited for a thickness of 1-50 nm, preferably 5 nm. The heating layer is designed to form a resistive element and conformally coats the walls and bottom of the openings 130, which are then completely filled with dielectric material 131, preferably the same used for forming the third dielectric layer 129. The heating layer is removed outside the openings 130 by CMP and the surface of the wafer 100 is planarized. The remaining portions of the heating layer form cup-shaped regions 132 having, in top plan view from above the surface, ovalized shape in the embodiment herein described.

Figure 5:
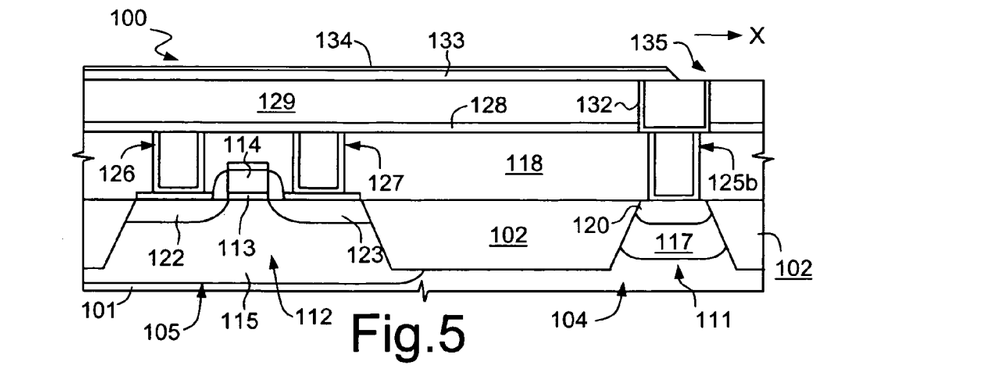
Figure 6:
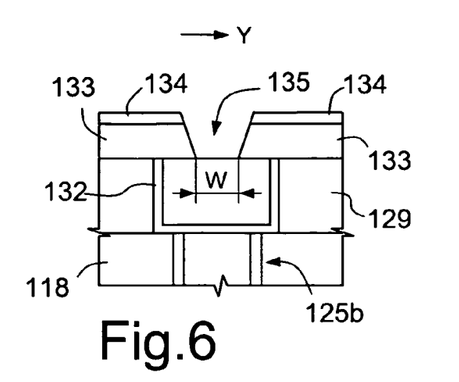
FIG. 6 is an enlarged detail of the semiconductor wafer of FIG. 5.
Figure 7:
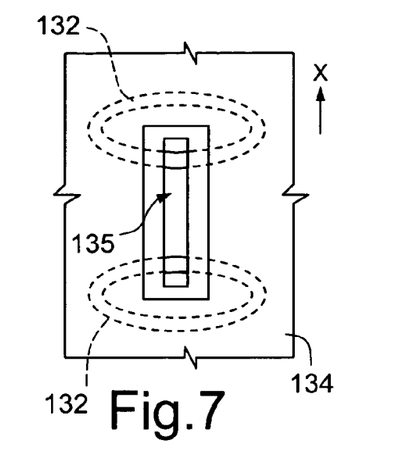
FIG. 7 is a top plan view of the enlarged detail of FIG. 6.

Next, FIGS. 5 and 6, a mold layer 133, preferably of silicon nitride and having a thickness of 60 nm, and an adhesion layer 134, for instance Ti, TiSiN or Si with a thickness of 1-10 nm, are deposited in sequence. Then, microtrenches 135 having a sublithographic bottom width W, e.g., of about 20-70 nm, are opened through the mold layer 133 and the adhesion layer 134. As shown in FIG. 7, the microtrenches 135 extend between two adjacent cup-shaped regions 132 in a direction perpendicular to the width W.

Figure 8:
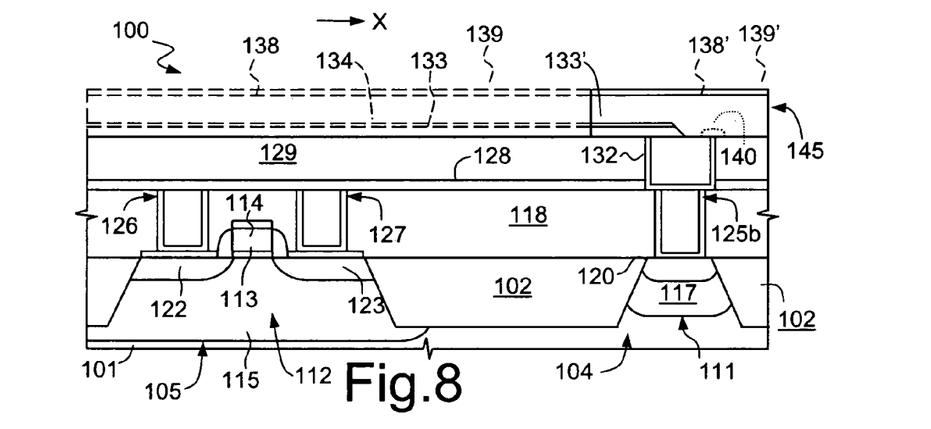
FIGS. 8-11 show the same view as FIG. 5, in subsequent manufacturing steps.

With reference to FIG. 8, a chalcogenic layer 138 of GST ($Ge_2Sb_2Te_5$), and a first barrier layer 139, preferably of Ti/TiN, are deposited on the adhesion layer 134, so that the chalcogenic layer 138 fills the microtrenches 135 with chalcogenic thin portions 138a. PCM cells 140 are defined in the thin portions 138a at intersections with the respective cup-shaped regions 132. The adhesion layer 134, the chalcogenic layer 138 and the first barrier layer 139 form a conductive stack 34, which is then shaped by a masked etch to define local bit lines 145 (only one local bit line 145 is illustrated in FIG. 8). In detail, each local bit line 145 comprises adhesion bands 134', a chalcogenic band 138' and a barrier band 139', which extend substantially through the whole length of the local bit lines 145. Moreover, each local bit line 145 mutually connects a respective plurality of PCM cells 140 arranged on a same column 110 (see also FIG. 1), and extends according to the column direction X.

Figure 9:
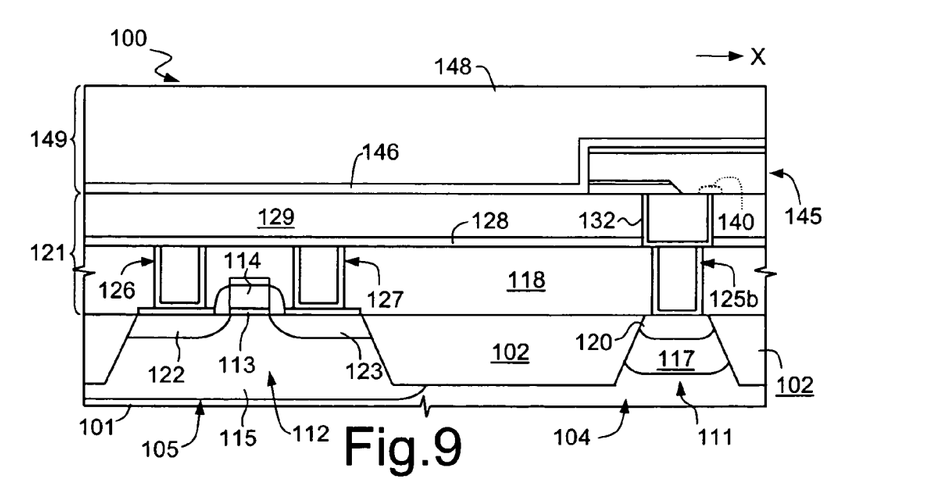

As illustrated in FIG. 9, the wafer 100 is then coated by a sealing layer 146, of silicon nitride, and a fourth dielectric layer 148, of USG, is deposited, thereby creating a second dielectric structure 149, which incorporates the local bit line 145. The sealing layer 146 tightly adheres to the third dielectric layer 129 and prevents delamination of the local bit line 145. After depositing the fourth dielectric layer 148, the wafer 100 is planarized, e.g., by CMP.

Figure 10:
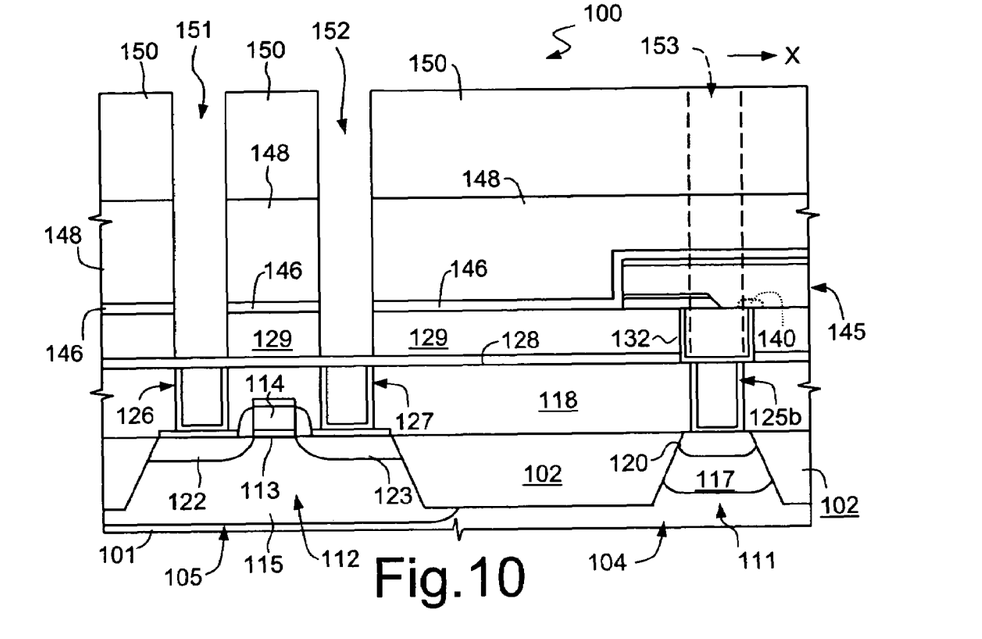
Figure 11:
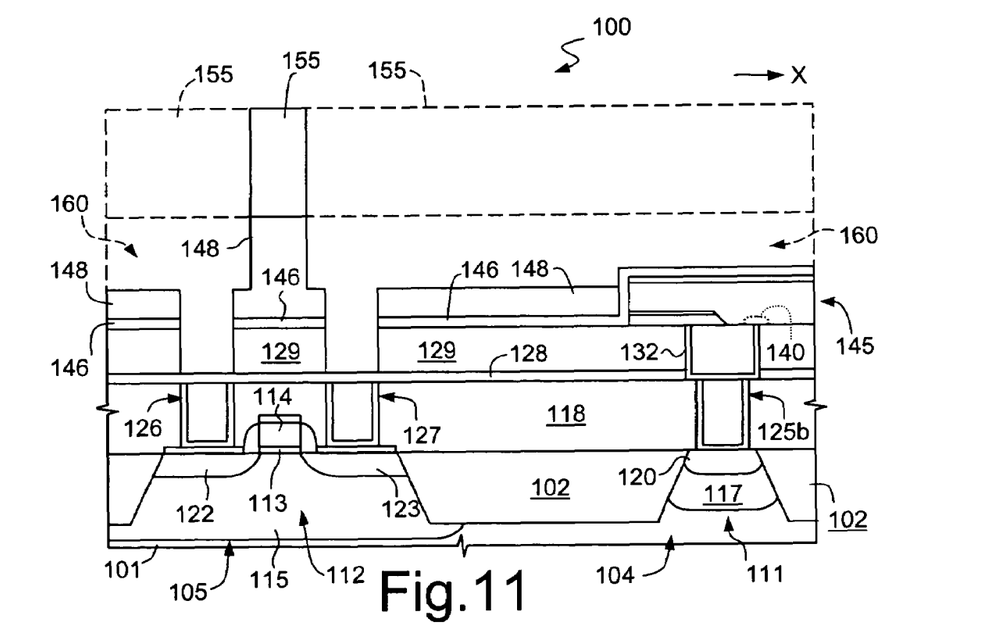
Figure 12:
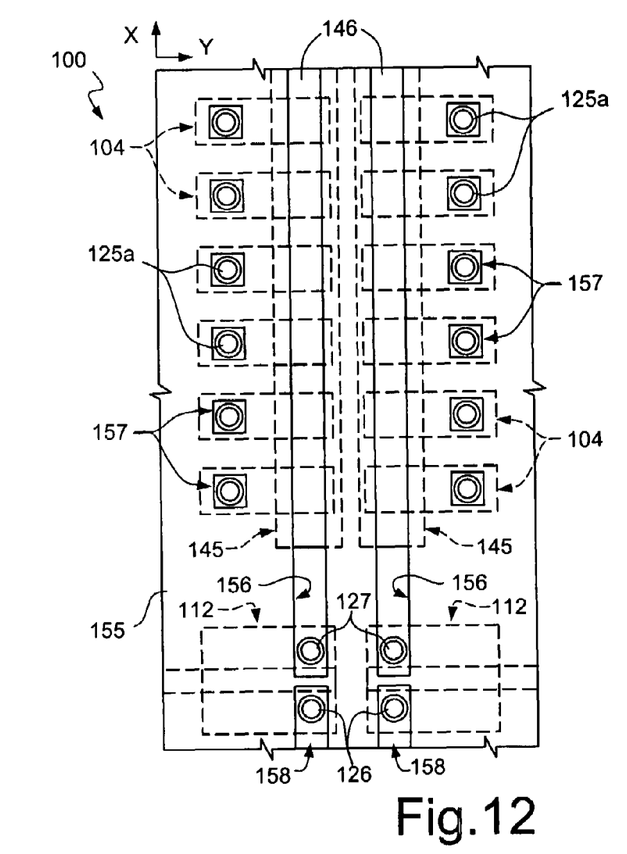
FIG. 12 is a top plan view of the semiconductor wafer of FIG. 11.

Two masked etches are subsequently carried out, as shown in FIGS. 10-12. On the wafer 100, a first mask 150 is formed, which has source holes 151 and drain holes 152, above the source contacts 126 and drain contacts 127, respectively. Moreover, the first mask 150 has base holes 153 (shown by dashed lines in FIG. 10) above the base contact regions (aligned with the emitter regions and not visible in the view of FIG. 10). The fourth dielectric layer 148, the sealing layer 146 and the third dielectric layer 129 are subsequently etched through the first mask 150, whereas the second dielectric layer 128 is left in tact.

The first mask 150 is then removed by stripping and a second mask 155 is formed on the wafer 100 (FIGS. 11 and 12). The second mask 155 includes array elongated openings 156, base openings 157 and control elongated openings 158. The array elongated openings 156 run above respective local bit lines 145 and extend in the column direction X to the drain contacts 127, which are enclosed therein with some clearance. Moreover, the array elongated openings 156 are narrower than the local bit lines 145. The base openings 157 surround the base contacts 125a (FIG. 12), with some clearance either. The control elongated openings run above the second active areas 105 according to predetermined paths, in a known manner, and expose the source contacts 126 of the column decoding transistors 112. The fourth dielectric layer 148 is then controllably etched through the second mask 155, until the sealing layer 146 is exposed below the elongated openings 156. Thus, a first level interconnection structure seat 160 is defined in the wafer 100. The second mask 155 is then removed by stripping.

Removing both the first mask 150 and the second mask 155 by stripping causes the wafer 100 to be exposed to oxygen, which may damage metallic bodies. In this step, however, the base contacts 125a (here not shown), the source contacts 126 and the drain contacts 127, all of tungsten, are still protected by the second dielectric layer 128. Similarly, the second dielectric layer 128 also protects against etching agents during the second masked etch. Although the etch is selective, in fact, long exposed parts might be damaged as well. In an embodiment not illustrated, anyway, the second dielectric layer 128 is removed through the first mask 150 immediately after the third dielectric layer 129.

Figure 13:
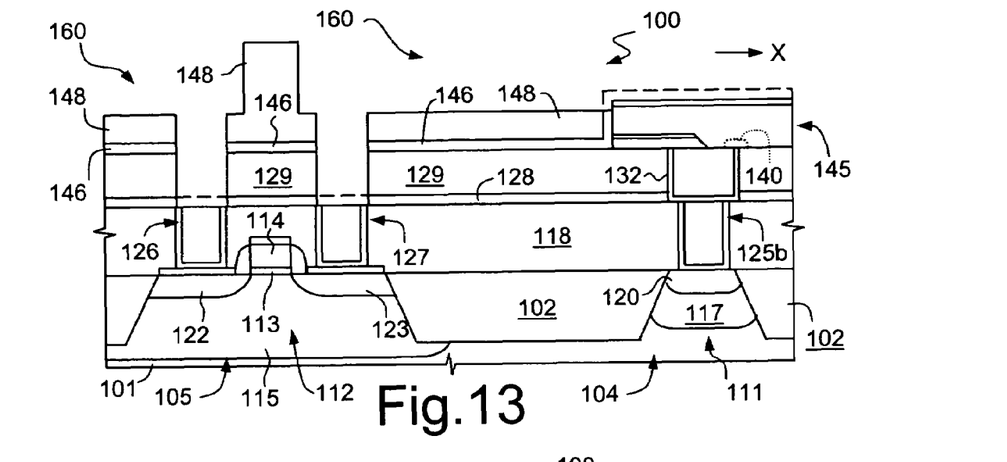
FIGS. 13 and 14 show the same view as FIG. 11 in a subsequent manufacturing step.

Once the second mask 155 has been eliminated, FIG. 13, exposed portions of the sealing layer 146 are removed from above the local bit lines 145, the base contacts 125a, the source contacts 126 and the drain contacts 127. The sealing layer 146 is blank etched, i.e., without using any mask, since all the exposed portions are to be removed.

Figure 14:
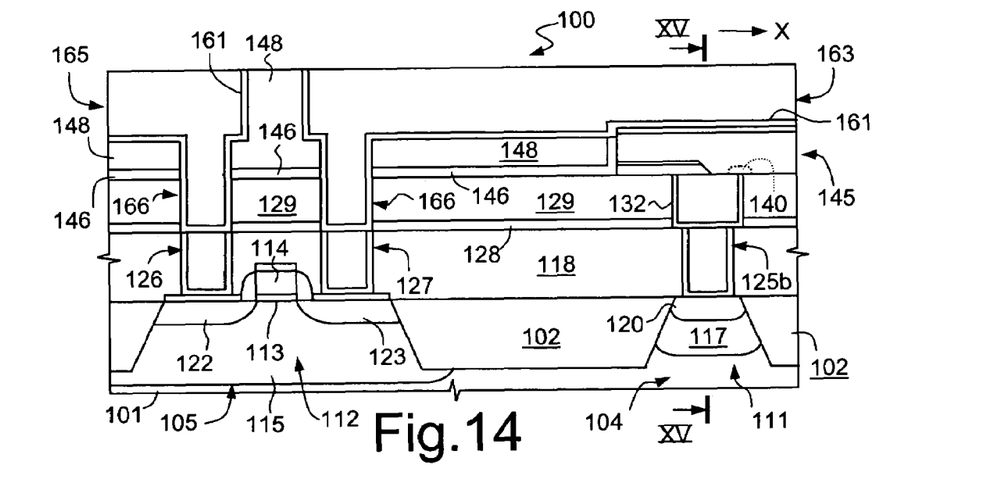
Figure 15:
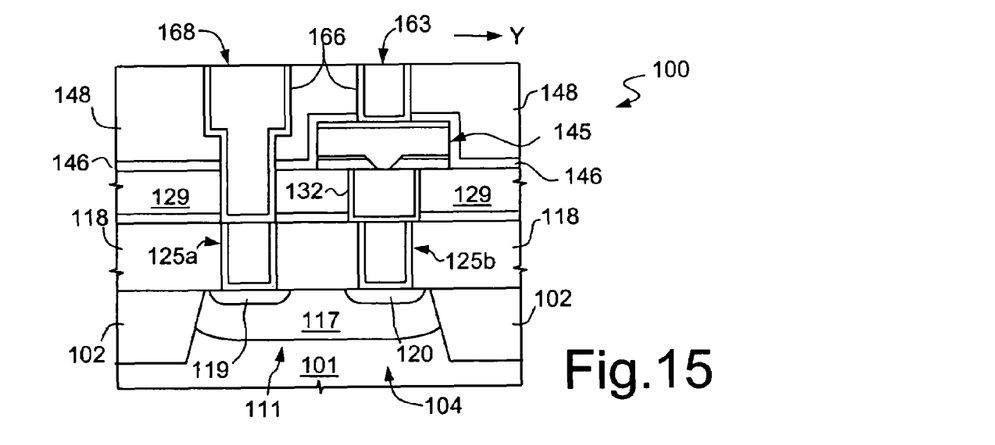
FIG. 15 is a cross section through the semiconductor wafer of FIG. 41, taken along lines XV-XV FIG. 14.

Then, a diffusion barrier layer 161 is conformally deposited, the first level interconnection structure seat 160 is filled with metal, e.g., copper, and the wafer 100 is planarized, as illustrated in FIGS. 14 and 15. A first level interconnection structure is thus formed, which includes metal bit lines 163 and metal control lines 165. The metal bit lines 163 lie on and in contact with respective local bit lines 145 and project therefrom in the column direction X to respective column decoding transistors 112. Moreover, ends of the metal bit lines 163 away from the local bit lines 145 are connected to the drain contacts 127 of the respective column decoding transistors 112 by respective first level metal vias 166. Further first level metal vias 166 connect ends of the metal control lines 165 to the source contacts 126 of respective column decoding transistors 112. Moreover, first level metal plugs 168 are created on respective base contacts 125a (see FIG. 15). Upper portions of the first level metal plugs 168 form contact pads.

Figure 16:
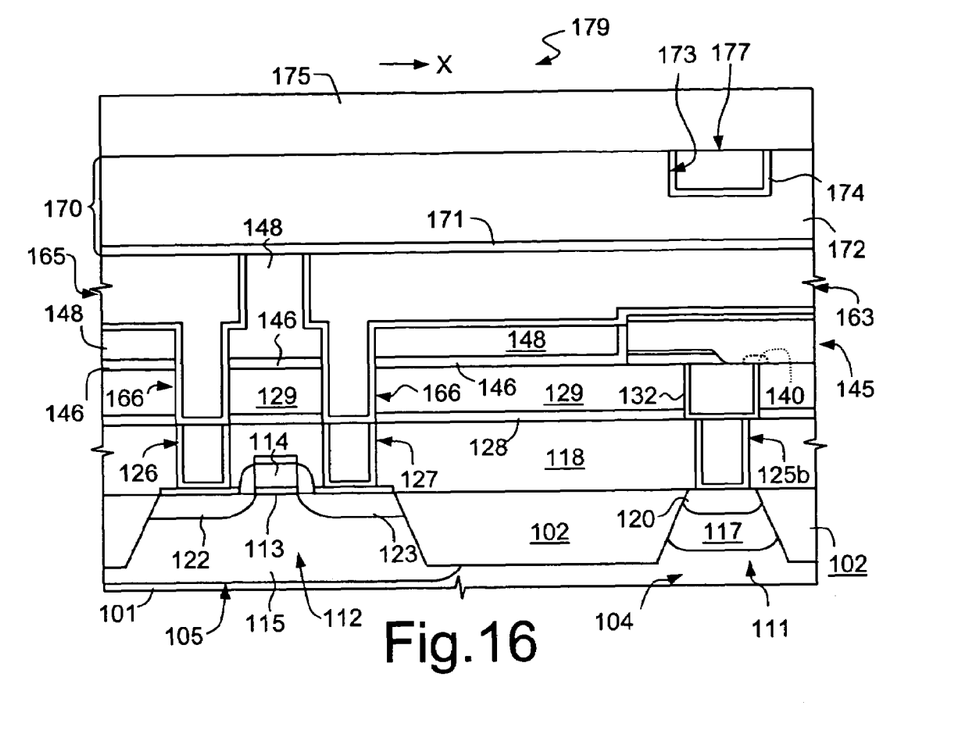
FIGS. 16 and 17 show the same views as FIGS. 14 and 15, respectively, in a final manufacturing step.
Figure 17:
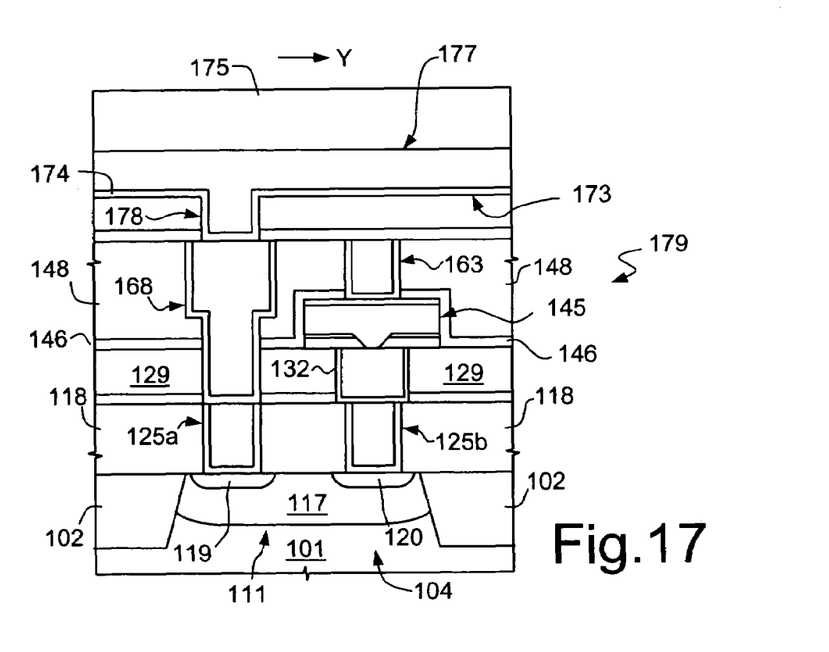

The process is terminated as illustrated in FIGS. 16 and 17. In particular, a third dielectric structure 170 is created on the second dielectric structure 149 by sequentially depositing a fifth dielectric layer 171, of silicon nitride, and a sixth dielectric layer 172, of silicon dioxide. The third dielectric structure 170, that covers the metal bit lines 163, is then etched twice for defining a second level interconnection structure seat 173 using a standard dual-damascene technique. Next, a diffusion barrier layer 174 is conformally deposited on the wafer 100 and the second level interconnection structure seat 173 is filled with metal (again copper, in the embodiment herein described). Finally, the wafer 100 is planarized and coated with a protective layer 175. Following upon planarization, a second level interconnection structure is formed above and spaced apart from the first level interconnection structure (which includes the metal bit lines 163 and the metal control lines 165) by the fifth dielectric layer 171 and the sixth dielectric layer 172. The second level interconnection structure includes metal word lines 177, running along the row direction Y above the metal bit lines 163 and the metal control lines. Moreover, the metal word lines 177 are connected to the first level metal plugs 168 (and therefore to the base contacts 125a) through second level metal vias 178.

A phase change memory device 179 as illustrated in FIGS. 16 and 17 is thus obtained. FIG. 18 shows an electric diagram of the phase change memory device 178 (local bit lines 145 are not shown herein).

Figure 19:
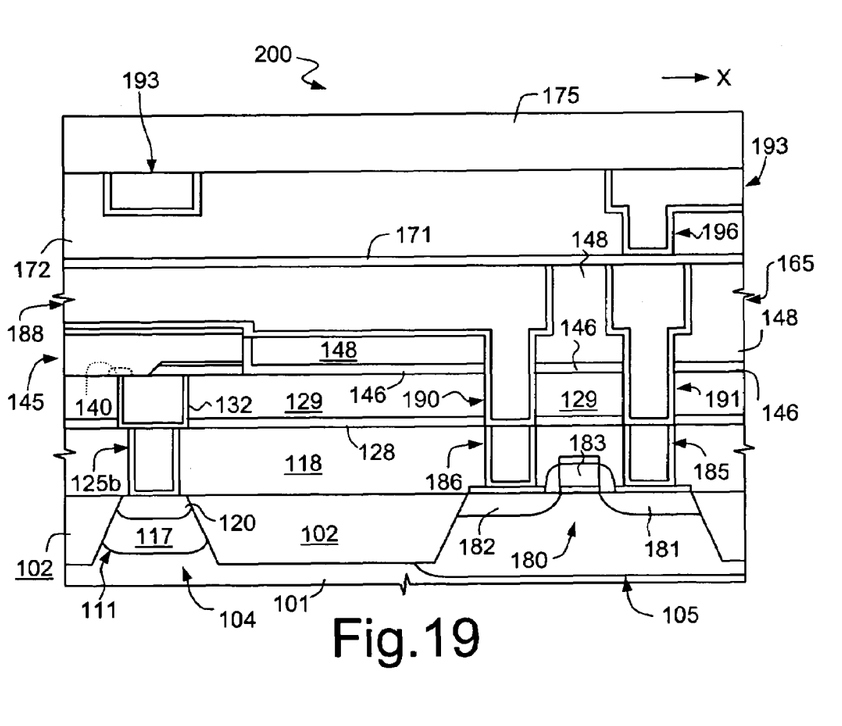
FIG. 19 is a cross section through a semiconductor wafer incorporating a phase change memory device made by a process according to a second embodiment of the present invention.

Another embodiment of the invention is shown in FIG. 19, where parts already illustrated in FIGS. 1-18 are designated by the same reference numbers. In a phase change memory device 200, NMOS column discharge transistors 180 (one for each column) are formed in a known manner in further second active areas 105, opposite to the second active areas 105 accommodating the column decoding transistors 112 (here not shown). The column discharge transistors 180 include respective source regions 181, drain regions 182 and gate regions 183 and are provided with source contacts 185 and drain contacts 186. A first level electrical interconnection structure includes metal bit lines 188, which lie on and in contact with respective local bit lines 145 and project therefrom in the column direction X to respective column discharge transistors 180. In particular, ends of the metal bit lines 188 are connected to respective drain contacts 186 by first level metal vias 190. First level metal plugs 191 are formed for connection to the source contacts 185. A second level electrical interconnection structure is formed above and spaced apart from the first level interconnection structure and includes metal word lines 193 and metal control lines 195. The metal word lines 193 run along the row direction Y (perpendicular to the sheet in the view of FIG. 19), whereas the metal control lines 195 have predetermined known paths. Moreover, the metal control lines 195 are connected to respective source contacts 185 through second level metal vias 196 and the first level metal plugs 191.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

Finally, it is clear that numerous modifications and variations may be made to the process and to the memory array described and illustrated herein, all falling within the scope of the invention, as defined in the attached claims. In the first place, the selection elements may comprise devices of a different type, such as MOS transistors or diodes. Moreover, in the above described preferred embodiments, the mold layer is made of silicon nitride, but it may of other materials as well, such as USG.

The invention claimed:

1. A process for manufacturing a phase change memory array, comprising the steps of:
   forming a plurality of phase change memory cells arranged in an array region of a semiconductor wafer, said phase change memory cells being arranged in rows and columns according to a row direction and to a column direction, respectively;
   forming a control circuit arranged in a control region of said semiconductor wafer;
   forming a plurality of conductive first bit line portions for mutually connecting phase change memory cells arranged on a same column;
   forming conductive first level electrical interconnection structures; and
   forming conductive second level electrical interconnection structures above said first level electrical interconnection structures, wherein said first level electrical interconnection structures include conductive second bit line portions laying on and in direct contact with said first bit line portions and projecting from said first bit line portions in said column direction for connecting said first bit line portions to said control circuit.

2. A process according to claim 1, comprising stacking said second bit line portions on said first bit line portions.

3. A process according to claim 1, wherein said step of forming said first bit line portions comprises:
   depositing a phase change layer of a phase change material; and
   shaping said phase change layer for forming phase change bands of said phase change material.

4. A process according to claim 3, wherein a first dielectric structure is created on said semiconductor wafer before depositing said phase change layer.

5. A process according to claim 4, wherein said step of forming said first level electrical interconnection structures comprises first selectively etching said first dielectric structure above said control circuit.

6. A process according to claim 5, wherein said step of first selectively etching comprises opening holes through said first dielectric structure.

7. A process according to claim 5, wherein said step of forming said second bit line portions comprises:
   on said first dielectric structure, creating a second dielectric structure, which incorporates said first bit line portions;
   opening a first level electrical interconnection structure seat in said second dielectric structure; and
   filling said first level electrical interconnection structure seat with metal.

8. A process according to claim 3, wherein said step of forming a plurality of phase change memory cells comprises:
   forming heating structures of a heating material;
   depositing a mold layer on said heating structures;
   in said mold layer, opening microtrenches having at least one sublithographic dimension; and
   filling said microtrenches with said phase change material.

9. A process according to claim 7, wherein said step of opening said first level electrical interconnection structure seat comprises second selectively etching said second dielectric structure for selectively exposing said first bit line portions.

10. A process according to claim 9, wherein said step of forming said second level electrical interconnection structures comprises:
    on said second dielectric structure, creating a third dielectric structure, which covers said first bit line portions;
    opening a second level electrical interconnection structure seat in said third dielectric structure; and
    filling said second level electrical interconnection structure seat with metal.

11. A process for manufacturing a phase change memory array, comprising the steps of:
    forming a plurality of phase change memory cells in an array region of a semiconductor wafer, said phase change memory cells being arranged in rows and columns according to a row direction and to a column direction, respectively;
    forming electrical components in a control region of said semiconductor wafer;
    forming a plurality of conductive first bit line portions for mutually connecting phase change memory cells arranged on a same column; and
    forming a plurality of conductive second bit line portions for connecting respective said first bit line portions to respective said electrical components, wherein said second bit line portions lie on and in direct contact with the respective first bit line portions and project from the respective first bit line portions in said column direction to the respective electrical components.

12. The process of claim 11 wherein said step of forming said first bit line portions comprises:
    depositing a first dielectric structure on said semiconductor wafer;
    depositing a phase change layer of a phase change material on the first dielectric structure; and
    shaping said phase change layer to provide phase change bands of said phase change material.

13. The process of claim 12 further comprising:
    forming a heating structure of a heating material in the first dielectric structure;
    depositing a mold layer on said heating structures;
    opening a microtrench in the mold layer, said microtrench having a contact of sublithographic dimension with first bit line and being filled with the phase change material.

14. The process of claim of claim 11 wherein said step of forming said second bit line portions comprises:
    forming a second dielectric structure on said first dielectric structure;
    opening a second bit line seat in said second dielectric structure; and
    filling said second bit line seat with metal to provide the second bit line portions.

15. A phase change memory device comprising
    a plurality of phase change memory cells arranged in an array region of a semiconductor wafer, said phase change memory cells being arranged in rows and columns according to a row direction and to a column direction, respectively;
    a control circuit arranged in a control region of said semiconductor wafer;
    a plurality of conductive first bit line portions for mutually connecting phase change memory cells arranged in a same column;
    conductive first level electrical interconnection structures; and
    conductive second level electrical interconnection structures arranged above said first level electrical interconnection structures, wherein said first level electrical interconnection structures include conductive second bit line portions laying on and in direct contact with said first bit line portions and projecting from said first bit line portions in said column direction for connecting said first bit line portions to said control circuit.

16. A phase change memory device according to claim 15, wherein said second bit line portions are stacked on said first bit line portions.

17. A phase change memory device according to claim 15, wherein said first bit line portions include respective phase change bands of a phase change material, which extend substantially through a whole length of said first bit line portions.

18. A phase change memory device according to claim 17, wherein said phase change memory cells comprise:
    heating structures of a heating material in the first dielectric structure;
    a mold layer formed on said heating structures; and
    microtrenches formed in said mold layer above said heating structures and filled with said phase change material of the first bit line portions, said microtrenches having a sublithographic dimension.

19. A phase change memory device according to claim 15, wherein said second bit line portions are of metal.

20. A phase change memory device according to claim 15, comprising a first dielectric structure, said first bit line portions being arranged on said first dielectric structure.

21. A phase change memory device according to claim 20, comprising first level metal vias for connecting said second bit line portions to said control circuit through said first dielectric structure.

22. A phase change memory device according to claim 21, comprising a second dielectric structure on said first dielectric structure, said second dielectric structure incorporating said first bit line portions.

23. A phase change memory device according to claim 22, wherein said second bit line portions are arranged in said second dielectric structure.

24. A phase change memory device according to claim 22, further comprising a third dielectric structure overlying said second dielectric structure, said second level electrical interconnection structures being arranged in said third dielectric structure.

25. A phase change memory device comprising:
a plurality of phase change memory cells in an array region of a semiconductor wafer, said phase change memory cells being arranged in rows and columns according to a row direction and to a column direction, respectively;
a plurality of electrical components in a control region of said semiconductor wafer;
a plurality of conductive first bit line portions, each mutually connecting the phase change memory cells arranged in a respective one of the columns; and
a plurality of conductive second bit line portions for connecting respective said first bit line portions to respective said electrical components, wherein said second bit line portions overlie and are in direct contact with the respective first bit line portions and project from the respective first bit line portions in said same column to the respective electrical components.

26. The phase change memory device of claim 25 wherein each of said plurality of first bit line portions include respective phase change bands of a phase change material, which extend substantially through a whole length of said first bit line portions.

27. The phase change memory device of claim 26 further comprising:
a first dielectric structure on the semiconductor wafer;
a heating structure of a heating material in the first dielectric structure;
a mold layer on said heating structures;
a microtrench in the mold layer having a contact of sublithographic dimension with the first bit line, wherein the microtrench is filled with the phase change material.

28. The phase change memory device of claim 25 further comprising: a second dielectric structure on said first dielectric structure, said second bit lines being formed in said second dielectric structure.

* * * * *

UNITED STATES PATENT AND TRADEMARK OFFICE
CERTIFICATE OF CORRECTION

| | | |
|---|---|---|
| PATENT NO. | : 7,606,056 B2 | Page 1 of 1 |
| APPLICATION NO. | : 11/317622 | |
| DATED | : October 20, 2009 | |
| INVENTOR(S) | : Pellizzer et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 817 days.

Signed and Sealed this

Fifth Day of October, 2010

David J. Kappos
*Director of the United States Patent and Trademark Office*